US007906722B2

(12) United States Patent
Fork et al.

(10) Patent No.: US 7,906,722 B2
(45) Date of Patent: *Mar. 15, 2011

(54) CONCENTRATING SOLAR COLLECTOR WITH SOLID OPTICAL ELEMENT

(75) Inventors: David K. Fork, Los Altos, CA (US); Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 968 days.

This patent is subject to a terminal disclaimer.

(21) Appl. No.: 11/110,611

(22) Filed: Apr. 19, 2005

(65) Prior Publication Data

US 2006/0231133 A1    Oct. 19, 2006

(51) Int. Cl.
*H02N 6/00* (2006.01)
(52) U.S. Cl. .......................... 136/246; 136/244
(58) Field of Classification Search ............... 136/293
See application file for complete search history.

(56) References Cited

U.S. PATENT DOCUMENTS

| 2,031,387 | A |   | 2/1936  | Schwarz |
|-----------|---|---|---------|---------|
| 2,789,731 | A |   | 4/1957  | Marraffino |
| 3,032,008 | A |   | 5/1962  | Land et al. |
| 3,159,313 | A |   | 12/1964 | Guilford |
| 3,602,193 | A |   | 8/1971  | Adams et al. |
| 3,973,994 | A |   | 8/1976  | Redfield |
| 3,988,166 | A | * | 10/1976 | Beam ............................ 136/246 |
| 4,018,367 | A |   | 4/1977  | Morine et al. |
| 4,021,267 | A |   | 5/1977  | Dettling |
| 4,045,246 | A |   | 8/1977  | Mlavsky et al. |
| 4,053,327 | A |   | 10/1977 | Meulenberg, Jr. |
| 4,084,985 | A |   | 4/1978  | Evans, Jr. |
| 4,086,485 | A | * | 4/1978  | Kaplow et al. ............. 250/203.4 |
| 4,095,997 | A |   | 6/1978  | Griffiths |

(Continued)

FOREIGN PATENT DOCUMENTS

CN    2606309 Y    3/2004

(Continued)

OTHER PUBLICATIONS

Akira Terao, "MicroDish: A Novel Reflective Optic For Flat-Plate Micro-Concentrator", SPIE's 49th Annual Meeting, Aug. 2-6, 2004, Denver, Colorado, USA, 9 pgs.

(Continued)

*Primary Examiner* — Alexa D Neckel
*Assistant Examiner* — Miriam Berdichevsky
(74) *Attorney, Agent, or Firm* — Bever, Hoffman & Harms, LLP; Patrick T. Bever (57) ABSTRACT

A Cassegrain-type concentrating solar collector cell includes primary and secondary mirrors disposed on opposing convex and concave surfaces of a light-transparent (e.g., glass) optical element. Light enters an aperture surrounding the secondary mirror, and is reflected by the primary mirror toward the secondary mirror, which re-reflects the light onto a photovoltaic cell mounted on a central region surrounded by the convex surface. The primary and secondary mirrors are preferably formed as mirror films that are deposited or plated directly onto the optical element. A concentrating solar collector array includes a sheet-like optical panel including multiple optical elements arranged in rows. The photovoltaic cells are mounted directly onto the optical panel, and the primary mirrors of the individual collector cells include metal film segments that are coupled by the photovoltaic cells to facilitate transmission of the generated electrical energy. Bypass diodes are connected in parallel with the photovoltaic cells.

25 Claims, 6 Drawing Sheets

U.S. PATENT DOCUMENTS

| | | | |
|---|---|---|---|
| 4,119,058 A | 10/1978 | Schmermund | |
| 4,131,485 A | 12/1978 | Meinel et al. | |
| 4,141,231 A | 2/1979 | Kudlich | |
| 4,148,301 A | 4/1979 | Cluff | |
| 4,153,476 A | 5/1979 | Shelpuk et al. | |
| 4,177,083 A | 12/1979 | Kennedy | |
| 4,221,468 A | 9/1980 | Macken | |
| 4,224,081 A | 9/1980 | Kawamura et al. | |
| 4,234,351 A | 11/1980 | Deminet et al. | |
| 4,254,894 A | 3/1981 | Fetters | |
| 4,320,251 A | 3/1982 | Narasimhan et al. | |
| 4,331,703 A | 5/1982 | Lindmayer | |
| 4,337,758 A | 7/1982 | Meinel et al. | |
| 4,355,196 A | 10/1982 | Chai | |
| 4,461,403 A | 7/1984 | Prahs | |
| 4,476,165 A | 10/1984 | McIntyre | |
| 4,490,418 A | 12/1984 | Yoshida | |
| 4,521,457 A | 6/1985 | Russell et al. | |
| 4,540,843 A | 9/1985 | Gochermann et al. | |
| 4,602,120 A | 7/1986 | Wakefield et al. | |
| 4,683,348 A | 7/1987 | Pidgeon et al. | |
| 4,711,972 A * | 12/1987 | O'Neill | 136/246 |
| 4,746,370 A | 5/1988 | Woolf | |
| 4,747,517 A | 5/1988 | Hart | |
| 4,792,685 A | 12/1988 | Yamakawa | |
| 4,796,038 A | 1/1989 | Allen et al. | |
| 4,826,777 A | 5/1989 | Ondris | |
| 4,841,946 A | 6/1989 | Marks | |
| 4,847,349 A | 7/1989 | Ohta et al. | |
| 4,849,028 A | 7/1989 | Krause | |
| 4,855,884 A | 8/1989 | Richardson | |
| 4,938,994 A | 7/1990 | Choinski | |
| 4,947,825 A | 8/1990 | Moriarty | |
| 4,952,026 A | 8/1990 | Bellman et al. | |
| 5,000,988 A | 3/1991 | Inoue et al. | |
| 5,004,319 A | 4/1991 | Smither | |
| 5,011,565 A | 4/1991 | Dube et al. | |
| 5,062,899 A | 11/1991 | Kruer | |
| 5,075,281 A | 12/1991 | Testardi | |
| 5,089,055 A | 2/1992 | Nakamura | |
| 5,151,377 A | 9/1992 | Hanoka et al. | |
| 5,167,724 A | 12/1992 | Chiang | |
| 5,180,441 A | 1/1993 | Cornwall et al. | |
| 5,213,628 A | 5/1993 | Noguchi et al. | |
| 5,216,543 A | 6/1993 | Calhoun | |
| 5,254,388 A | 10/1993 | Melby et al. | |
| 5,344,496 A * | 9/1994 | Stern et al. | 136/246 |
| 5,353,813 A | 10/1994 | Deevi et al. | |
| 5,356,488 A | 10/1994 | Hezel | |
| 5,389,159 A | 2/1995 | Kataoka et al. | |
| 5,404,869 A | 4/1995 | Parkyn, Jr. et al. | |
| 5,449,413 A | 9/1995 | Beauchamp et al. | |
| 5,501,743 A | 3/1996 | Cherney | |
| 5,529,054 A | 6/1996 | Shoen | |
| 5,536,313 A | 7/1996 | Watanabe et al. | |
| 5,538,563 A | 7/1996 | Finkl | |
| 5,540,216 A * | 7/1996 | Rasmusson | 126/683 |
| 5,543,333 A | 8/1996 | Holdermann | |
| 5,552,820 A | 9/1996 | Genovese | |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,733,608 A | 3/1998 | Kessel et al. | |
| 5,873,495 A | 2/1999 | Saint-Germain | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,011,307 A | 1/2000 | Jiang et al. | |
| 6,020,554 A | 2/2000 | Kaminar et al. | |
| 6,047,862 A | 4/2000 | Davies | |
| 6,091,017 A | 7/2000 | Stern | |
| 6,118,067 A | 9/2000 | Lashley et al. | |
| 6,130,465 A | 10/2000 | Cole | |
| 6,140,570 A | 10/2000 | Kariya | |
| 6,203,621 B1 | 3/2001 | Tran et al. | |
| 6,232,217 B1 | 5/2001 | Ang et al. | |
| 6,257,450 B1 | 7/2001 | Jackson et al. | |
| 6,274,508 B1 | 8/2001 | Jacobsen et al. | |
| 6,278,054 B1 * | 8/2001 | Ho et al. | 136/256 |
| 6,293,498 B1 | 9/2001 | Stanko et al. | |
| 6,310,281 B1 | 10/2001 | Wendt et al. | |
| 6,323,415 B1 | 11/2001 | Uematsu et al. | |
| RE37,512 E | 1/2002 | Szlufcik et al. | |
| 6,379,521 B1 | 4/2002 | Nishio | |
| 6,398,370 B1 | 6/2002 | Chiu et al. | |
| 6,407,329 B1 | 6/2002 | Iino et al. | |
| 6,410,843 B1 | 6/2002 | Kishi et al. | |
| 6,418,986 B1 | 7/2002 | Gabriele | |
| 6,420,266 B1 | 7/2002 | Smith et al. | |
| 6,423,140 B1 | 7/2002 | Liu et al. | |
| 6,429,037 B1 | 8/2002 | Wenham et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,890,167 B1 | 5/2005 | Kwok et al. | |
| 6,896,381 B2 | 5/2005 | Benitez et al. | |
| 6,924,493 B1 | 8/2005 | Leung | |
| 6,958,868 B1 | 10/2005 | Pender | |
| 7,045,794 B1 | 5/2006 | Spallas et al. | |
| 7,101,592 B2 | 9/2006 | Gueggi et al. | |
| 7,152,985 B2 | 12/2006 | Benitez et al. | |
| 7,160,522 B2 | 1/2007 | Dominguez et al. | |
| 7,181,378 B2 | 2/2007 | Benitez et al. | |
| 7,388,147 B2 | 6/2008 | Mulligan et al. | |
| 7,394,016 B2 | 7/2008 | Gronet | |
| 2001/0008230 A1 | 7/2001 | Keicher et al. | |
| 2002/0056473 A1 | 5/2002 | Chandra et al. | |
| 2002/0060208 A1 | 5/2002 | Liu et al. | |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0015820 A1 | 1/2003 | Yamazaki et al. | |
| 2003/0095175 A1 | 5/2003 | Agorio | |
| 2003/0129810 A1 | 7/2003 | Barth et al. | |
| 2003/0201581 A1 | 10/2003 | Weber et al. | |
| 2003/0232174 A1 | 12/2003 | Chang et al. | |
| 2004/0012676 A1 | 1/2004 | Weiner | |
| 2004/0031517 A1 | 2/2004 | Bareis | |
| 2004/0048001 A1 | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka et al. | |
| 2004/0200520 A1 | 10/2004 | Mulligan et al. | |
| 2004/0211460 A1 | 10/2004 | Simburger et al. | |
| 2005/0000566 A1 | 1/2005 | Posthuma et al. | |
| 2005/0029236 A1 | 2/2005 | Gambino et al. | |
| 2005/0034751 A1 | 2/2005 | Gross et al. | |
| 2005/0046977 A1 * | 3/2005 | Shifman | 359/853 |
| 2005/0067729 A1 | 3/2005 | Laver et al. | |
| 2005/0081908 A1 | 4/2005 | Stewart | |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2005/0253308 A1 | 11/2005 | Sherwood | |
| 2006/0207650 A1 | 9/2006 | Winston et al. | |
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2008/0047605 A1 | 2/2008 | Benitez et al. | |
| 2008/0138456 A1 | 6/2008 | Fork et al. | |
| 2008/0186593 A1 | 8/2008 | Chan et al. | |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 10/1985 |
| JP | 02 187291 A | 7/1990 |
| JP | 2002-111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

Kenis et al. "Fabrication inside Microchannels Using Fluid Flow", Accounts of Chemical Research, vol. 33, No. 12, 2000, pp. 841-847.
Kerschaver et al. "Back-contact Solar Cells: A Review," Progress in Photovoltaics: Research and Applications, 2006, vol. 14, pp. 107-123.
Neuhaus et al. "Industrial Silicon Wafer Solar Cells," Advances in OptoElectronics, vol. 2007, 2007, 15 pages.
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.
SunPower Corp. News Release, May 12, 2008, Available URL: http://investors.sunpowercorp.com/releasedetail.cfm?ReleaseID=309613.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2O_3$-$WO_3$ compounds for photocatalytic applications by solid state and viscous processing", Title from a conference scheduled for Oct. 6-7, 2004 in Munich, 8 pages.
Kränzl et al. "Bifacial Solar Cells on Multi-Crystalline Silicon", 15th International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
U.S. Appl. No. 11/282,882, filed Nov. 17, 2005, Fork et al.
Recart et al. "Large Area Thin BSF Solar Cells With Simultaneously Diffused Boron and Phosphorus Screen Printed Emitters", IEEE, pp. 1213-1216, 2005.
Taguchi et al. An Approach for the Higher Efficiency in the HIT Cells, IEEE, pp. 866-871, 2005.
Van Hoy et al. "Microfabrication of Ceramics by Co-extrusion", *J. Am. Ceram. Soc.*, vol. 81, No. 1, pp. 152-158, 1998.
U.S. Appl. No. 11/282,829, filed Nov. 17, 2005, Fork et al.
U.S. Appl. No. 11/336,714, filed Jan. 20, 2006, Fork et al.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.
Extrusion/Coextrusion Dies, Extrusion Dies Industries, LLC, http://www.extrusiondies.com/Products/ExtrusionDies/multimanifold-Dies.html, 1 page.
Hitachi: Offering Total Environmental Solutions, Environmental Activities, http://greenweb.hitachi.co.jp/en/sustainable/total-solution.html, 5 pages, 2003.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
"Optical performance at the thermodynamic limit with tailored imagin designs", by Jeffrey M. Gordon et al., Dec. 2004, 16 pages.
"A Flat-Plate Concentrator: Micro-Concentrator Design Overview", by W.P Mulligan et al., pp. 1495-1497, 0-7803-5772-8/00/$10.00 Copyright 2000 IEEE.
"The Promise of Concentrators", by Richard M. Swanson, Received Jun. 16, 1999, Revised Oct. 3, 1999, pp. 93-111 (19 pages).
"FLATCON™ and FLASHCON™ Concepts for High Concentration PV", by A.W. Bett et al., Presented at the 19th European Photovoltaic Solar Energy Conf, Jun. 7-11, 2004, Paris, 4 pages.
"RXI Concentrator for 1000X Photovoltaic Energy Conversion", by Jose L. Alvarez et al.
"Development Of Chip-Size Silicon Solar Cells", by William P. Mulligan et al.
"Wafer Level Packaging For Analog/Mixed Signal Applications", by Luu Nguyen; MEPTEC Int. Wafer Level Packaging Conference, Aug. 22, 2002.
Benitez et al. "High-Concentration Mirror-Based Kohler Integrating System for Tandem Solar Cells", WCPEC2006, 4 pages.
J. Sun et al. "Modeling and Experimental Evaluation of Passive Heat Sinks for Miniature High-Flux Photovoltaic Concentrators", Transactions of the ASME, vol. 127, pp. 138-145 (2005).
Terao et al. "A Mirror-Less Design for Micro-Concentrator Modules", Conference Record of the 28th IEEE Photovoltaic Specialists Conference (2000) pp. 1416-1419.
Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.
Nijs et al. "Overview of solar cell technologies and results on high efficiency multicrystalline silicon substrates," Solar Energy Materials and Solar Cells, vol. 48, No. 1-4, Nov. 1, 1997, pp. 199-217.
Sparber et al. "Comparison of texturing methods for monocrystalline silicon solar cells using KOH and $Na_2CO_3$," 3rd World Conf. Photovoltaic Energy Conversion, Osaka, 2003, pp. 1372-1375.
MacDonald et al. "Texturing industrial multicrystalline silicon solar cells," Solar Energy, vol. 76, 2004, pp. 277-283.
Tool et al. "Straightforward in-line processing for 16.8% efficient mc-Si solar cells," 31st IEEE Photovoltaic Specialists Conf., Florida, 2005, pp. 1324-1327.
Fukui et al. "17.7% efficiency large area multicrystalline silicon solar cell using screen-printed metallization technique," 31st IEEE Photovoltaic Specialists Conf., Florida, 2005, pp. 979-982.
Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.
Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists," *Physics Today*, Jul. 2008, pp. 42-47.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells", Oct. 1999, IEEE Transactions on Electron Devices, vol. 46, No. 10, pp. 2055-2061.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

Bejan, Adrian "Chapter Five, Buckling Flows: A New Frontier in Fluid Mechanics", Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of $CuInSe_2$ Thin Films-Comparison of Femtosecond and Picosecond Laser Ablation", Applied Surface Science, vol. 247, No. 1-4, Jul. 15, 2005, pp. 447-452.

* cited by examiner

CONCENTRATING SOLAR COLLECTOR WITH SOLID OPTICAL ELEMENT

FIELD OF THE INVENTION

This invention relates to solar power generators, more particularly to concentrating solar collectors.

BACKGROUND OF THE INVENTION

Photovoltaic solar energy collection devices used to generate electric power generally include flat-panel collectors and concentrating solar collectors. Flat collectors generally include photovoltaic cell arrays and associated electronics formed on semiconductor (e.g., monocrystalline silicon or polycrystalline silicon) substrates, and the electrical energy output from flat collectors is a direct function of the area of the array, thereby requiring large, expensive semiconductor substrates. Concentrating solar collectors reduce the need for large semiconductor substrates by concentrating light beams (i.e., sun rays) using, e.g., a parabolic reflectors or lenses that focus the beams, creating a more intense beam of solar energy that is directed onto a small photovoltaic cell. Thus, concentrating solar collectors have an advantage over flat-panel collectors in that they utilize substantially smaller amounts of semiconductor. Another advantage that concentrating solar collectors have over flat-panel collectors is that they are more efficient at generating electrical energy.

A problem with conventional concentrating solar collectors is that they are expensive to produce, operate and maintain. The reflectors and/or lenses used in conventional collectors to focus the light beams are produced separately, and must be painstakingly assembled to provide the proper alignment between the focused beam and the photovoltaic cell. Further, over time, the reflectors and/or lenses can become misaligned due to thermal cycling or vibration, and become dirty due to exposure to the environment. Maintenance in the form of cleaning and adjusting the reflectors/lenses can be significant, particularly when the reflectors/lenses are produced with uneven shapes that are difficult to clean.

What is needed is a concentrator-type PV cell and array that avoids the expensive assembly and maintenance costs associated with conventional concentrator-type PV cells.

SUMMARY OF THE INVENTION

The present invention is directed to an efficient Cassegrain-type concentrating solar collector that collects (e.g., focuses or otherwise concentrates) light onto a photovoltaic cell by reflecting the light between primary and secondary mirrors attached to opposing internal surfaces of a solid, light-transmitting (e.g., glass) optical element. The optical element includes a relatively large convex (protruding) lower surface, and an upper surface including a flat aperture and a relatively small concave (curved) surface (e.g., a depression) located at a center of the aperture. The primary and secondary mirrors are arranged such that the reflective surfaces face into the optical element. In one embodiment, the convex and concave surfaces are associated conic (e.g., hyperbolic and/or parabolic) surfaces arranged such that light passing through the aperture onto any point on the primary mirror is reflected to a corresponding point on the secondary mirror, which in turn re-reflects the light toward the apex of the primary mirror, where a photovoltaic cell is mounted to convert the light into electrical energy. Because the optical element is solid (i.e., because the convex and concave surfaces remain fixed relative to each other), the primary and secondary mirrors remain permanently aligned, thus maintaining optimal optical operation while minimizing maintenance costs. Moreover, the loss of light at gas/solid interfaces is minimized because only solid optical element material (e.g., low-iron glass) is positioned between the primary and secondary mirrors.

In accordance with an embodiment of the invention, the primary and secondary mirrors are films that are directly formed (e.g., deposited or plated) onto the convex and concave surfaces, respectively, of the optical element. By carefully molding the optical element to include convex and concave surfaces having the desired shape and position, the primary and secondary mirrors are essentially self-forming and self-aligned when formed as mirror material films, thus greatly simplifying the manufacturing process and minimizing production costs. Forming the primary and secondary mirrors directly on the optical element also facilitates simultaneous low-cost plating of both mirrors using the same mirror material (e.g., silver), thus further reducing manufacturing costs.

In accordance with another embodiment of the invention, the optical element is utilized as the backplane structure for supporting both the photovoltaic cell and the associated conductors that electrically connect multiple photovoltaic cells in series to form a collector array, thereby eliminating the need for a separate printed circuit board, thus reducing manufacturing costs.

In accordance with another embodiment of the present invention, the primary mirror includes two or more metal film portions that are disposed on different regions of the convex surface and separated by one or more narrow gap. The formation of the primary mirror using two or more spaced-apart metal film portions facilitates the use of primary mirror as the conductive path electrically linking photovoltaic cells of adjacent collectors in a concentrating solar collector array. In one embodiment, each primary mirror includes two metal film halves that are separated by a gap extending through a central region that is surrounded by the convex surface, and the adjacent metal film halves are linked by the photovoltaic cell mounted on the central region. An associated bypass transistor is connected in series with each photovoltaic cell to avoid array failure due to photovoltaic cell malfunction.

In accordance with another embodiment of the present invention, a heat sink is provided on each photovoltaic cell to facilitate heat transfer from the cell to the adjacent primary mirror sections, thereby reducing the need for active or passive cooling.

In accordance with another embodiment of the present invention, the photovoltaic cell and other components (e.g., bypass diodes and heat sinks) are surface mounted onto a flattened central region using high-speed pick-and-place equipment. An optional dielectric layer (e.g., solder mask) is provided between the photovoltaic cell and underlying portions of primary mirror film that are located on the flattened central region to facilitate proper electrical connection.

In accordance with another embodiment of the present invention, the secondary mirror is covered with a sealant structure having a flat upper surface that is coplanar with the aperture surface, thereby providing the array with a flat surface that can be cleaned easily, thus minimizing maintenance costs. Further, the sealant structure protects the secondary mirror from corrosion.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
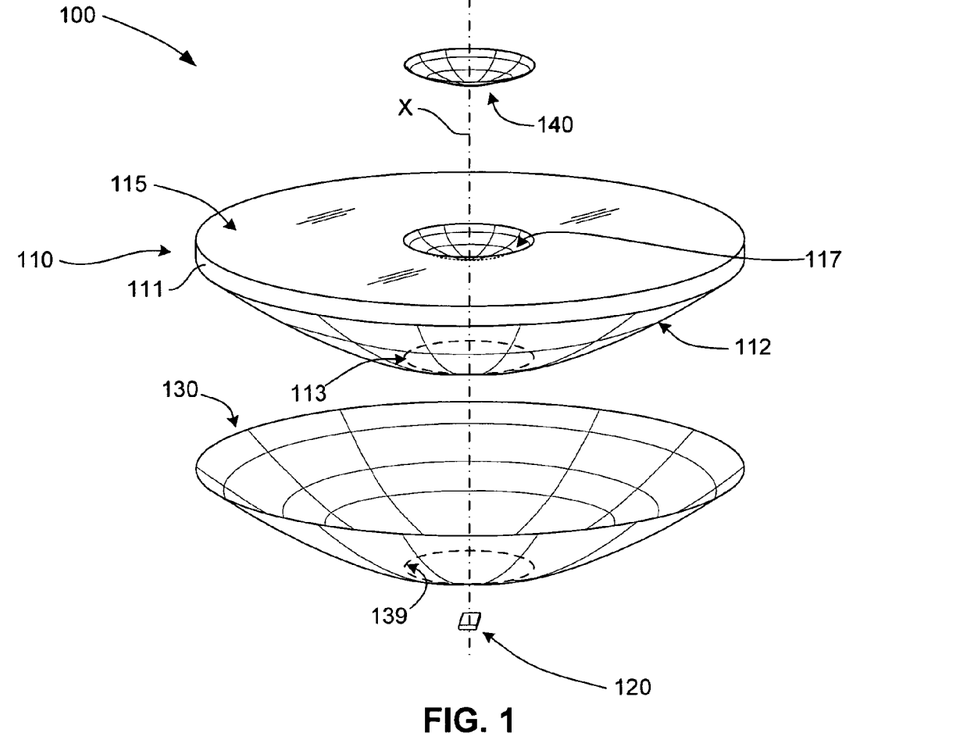
FIG. 1 is an exploded perspective view showing a concentrating solar collector cell according to an embodiment of the present invention.

FIG. 1 is an exploded perspective view showing an internal mirror, Cassegrain-type concentrating solar collector 100 according to an embodiment of the present invention. Concentrating solar collector 100 generally includes an optical element 110, a photovoltaic cell 120, a primary mirror 130, and a secondary mirror 140. Optical element 110 is a solid, disk-like, light-transparent structure including an upper layer 111, a relatively large convex surface 112 protruding from a lower side of upper layer 111, a substantially flat aperture surface 115 disposed on an upper side of upper layer 111, and a relatively small concave (curved) surface (depression) 117 defined in aperture surface 115 (i.e., extending into upper layer 111). In order to minimize material, weight, thickness and optical adsorption, upper layer 111 may be vanishingly small. The concavity of secondary mirror 140 may extend beyond the thickness of upper layer 111. Photovoltaic cell 120 is located in a central region 113, which is located in the center of and surrounded by convex surface 112. Primary mirror 130 is disposed on convex surface 112 and secondary mirror 140 is disposed on concave surface 117. Primary mirror 130 and secondary mirror 140 are shaped and arranged such that, as described in further detail below, a light beam (ray) traveling in a predetermined direction (e.g., perpendicular to aperture surface 115) that enters optical element 110 through a specific region of aperture surface 115 is reflected by a corresponding region of primary mirror 130 to an associated region of secondary mirror 140, and from the associated region of secondary mirror 140 to photovoltaic cell 120 (e.g., directly from secondary mirror 140 to photovoltaic cell 120, or by way of a reflective or refractive surface positioned between secondary mirror and photovoltaic cell 120). As used herein, directional terms such as "upper", "lower", "above" and "below" are intended to provide relative positions for purposes of description, and are not intended to designate an absolute frame of reference.

In accordance with an embodiment of the present invention, primary mirror 130 and secondary mirror 140 are fabricated by sputtering or otherwise depositing a reflective mirror material (e.g., silver (Ag) or aluminum (Al)) directly onto convex surface 112 and concave surface 117, thereby minimizing manufacturing costs and providing superior optical characteristics. By sputtering or otherwise forming a mirror film on convex surface 112 and concave surface 117 using a known mirror fabrication technique, primary mirror 130 substantially takes the shape of convex surface 112, and secondary mirror 140 substantially takes the shape of concave surface 117. As such, optical element 110 is molded or otherwise fabricated such that convex surface 112 and concave surface 117 are arranged and shaped to produce the desired mirror shapes. Note that, by forming convex surface 112 and concave surface 117 with the desired mirror shape and position, primary mirror 130 and secondary mirror 140 are effectively self-forming and self-aligning, thus eliminating expensive assembly and alignment costs associated with conventional concentrating solar collectors. Further, because primary mirror 130 and secondary mirror 140 remain affixed to optical element 110, their relative position is permanently set, thereby eliminating the need for adjustment or realignment that may be needed in conventional multiple-part arrangements. In one embodiment, primary mirror 130 and secondary mirror 140 are formed simultaneously using the same (identical) material or materials (e.g., plated Ag), thereby minimizing fabrication costs. Further, by utilizing the surfaces of optical element 110 to fabricate the mirrors, once light enters into optical element 110 through aperture surface 115, the light is only reflected by primary mirror 130/convex surface 112 and secondary mirror 140/concave surface 117 before reaching photovoltaic cell 120. As such, the light is subjected to only one air/glass interface (i.e., aperture surface 115), thereby minimizing losses that are otherwise experienced by conventional multi-part concentrating solar collectors. The single air/glass interface loss can be further lowered using an antireflection coating on aperture surface 115. Although it is also possible to separately form primary mirror 130 and secondary mirror 140 and then attach the mirrors to convex surface 112 and concave surface 117, respectively, this production method would greatly increase manufacturing costs and may reduce the superior optical characteristics provided by forming mirror films directly onto convex surface 112 and concave surface 117.

In one specific embodiment, optical element 110 is molded using a low-iron glass (e.g., Optiwhite glass produced by Pilkington PLC, UK) structure according to known glass molding methods. Molded low-iron glass provides several advantages over other production methods and materials, such as superior transmittance and surface characteristics (molded glass can achieve near perfect shapes due to its high viscosity, which prevents the glass from filling imperfections in the mold surface). Although molded glass is currently preferred for fabricating optical element 110 due to its superior optical characteristics, some of the advantages described herein may be achieved by optical elements formed using other light-transmitting materials and/or fabrication techniques. For example, clear plastic may be machined and polished to form single-piece optical element 110, or separate pieces by be glued or otherwise secured to form optical element 110.

Figure 2:
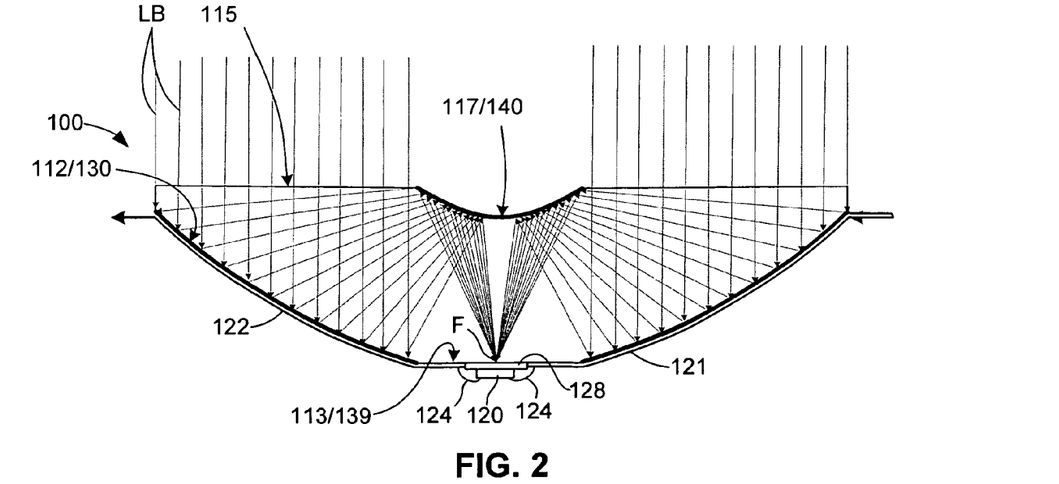
FIG. 2 is a side view showing the concentrating solar collector cell of FIG. 1 during operation.

FIG. 2 is a side view showing concentrating solar collector 100 during operation. Similar to conventional concentrating solar collectors, a collector positioning system (not shown; for example, the tracking system used in the MegaModule™ system produced by Amonix, Incorporated of Torrance, Calif., USA) is utilized to position concentrating solar collector 100 such that light beams LB (e.g., solar rays) are directed into aperture surface 115 in a desired direction (e.g., perpendicular to aperture surface 115. Photovoltaic cell 120 is disposed substantially in a concentrating region F, which designates the region at which light beams LB are concentrated by primary mirror 130, secondary mirror 140 and any intervening optical structures (e.g., a dielectric flux concentrator). In the disclosed embodiment, concentrating region F coincides with a central region 113, which has been planarized (flattened) to facilitate the mounting of photovoltaic cell 120 and associated wiring using conventional pick-and-place and/or lithographic processing. Note that central region 113 is located directly below and thus defined by the "shadow" of secondary mirror 120. Note also that an opening 139 is defined in primary mirror 130 to facilitate the passage of light through central region 113 to photovoltaic cell 120. To facilitate the positioning of concentrating region F in central region 113, convex surface 112, primary mirror 130, concave surface 117, and secondary mirror 140 are centered on and substantially symmetrical about an optical axis X that extends substantially perpendicular to aperture surface 115 (i.e., the curved portions of convex surface 112 and concave surface 117 are defined by an arc rotated around optical axis X). Note also that the focus depth (i.e., the distance between secondary mirror 140 and photovoltaic cell 120) may be adjusted depending on the selected optics. For example, the optics may be selected to produce a shorter focal length that facilitates recessing central region 113 (and, thus, photovoltaic cell 120) inside optical element 110. Alternatively, the optics may be selected to produce a longer focal length that facilitates forming central region 113 at the end of a mesa extending below convex surface 112.

The size and shape of optical element 110 may be altered to optimize a specific function. In comparison to modules constructed from larger concentrators, modules constructed from solid concentrators having a relatively small diameter will require more assembly time, for the larger number of concentrators that would be required to generate a desired power output, but such modules would incur less absorption loss than modules constructed from larger concentrators. Further, as suggested above, the shape of primary mirror 130 and secondary mirror 140 may take a wide variety of shapes in order to achieve a desired concentration region. In one specific embodiment, optical element 110 has an outer diameter of 28 mm, an outer diameter of concave 117 of 6.8 mm, and a thickness of 7.5 mm, convex surface 112 is formed as a hyperbolic surface having a radius of 15.000 mm and a conic constant of −1.030, and depression 117 is also a hyperbolic surface having a radius of 3.438 mm and a conic constant of −2.752. In another embodiment, convex surface 112 is parabolic and concave surface 117 is hyperbolic. Those skilled in the art of optics will recognize that other conic or otherwise curved surfaces may be utilized to achieve the internal reflection necessary to transmit light to photovoltaic cell 120.

Photovoltaic cell 120 is mounted either directly onto or adjacent to optical element 110, depending on the location of concentration region F and the location of central region 113. As indicated in FIG. 2, in one embodiment central region 113 includes a flat, circular area located substantially at the apex of convex surface 112. In other embodiments, central area 113 may be recessed into optical element 110 (i.e., nearer to concave surface 117), or located on a raised structure (i.e., further from concave surface 117). In one embodiment, photovoltaic cell 120 is mounted onto central region 113 by way of a gap filling transparent adhesive 128 such as silicone (e.g., polydiphenylsiloxane or polymethylphenylsiloxane) that serves to minimize the disruptive break in the refractive indicies between the outside surface of central region 113 and photovoltaic cell 120. Photovoltaic cell 120 can then be connected by way of standard wire bonds 124 to external wiring. Suitable photovoltaic (concentrator solar) cells are produced, for example, by Spectrolab, Inc. of Sylmar, Calif., USA.

According to another aspect of the present invention, optical element 110 is utilized as the backplane structure for supporting both photovoltaic cell 120 and conductors 121 and 122 that are connected to photovoltaic cell 120 by way of conventional wire bond structures 124 and/or soldered interconnections. In one embodiment, conductors 121 and 122 may be formed, for example, printing or etching conductive material over primary mirror 130, e.g., by way of an insulation (dielectric) layer. In another embodiment, discussed below, the primary mirror material is utilized to form the conductive path (i.e., thus obviating the need for separate conductors 121 and 122).

Figure 3:
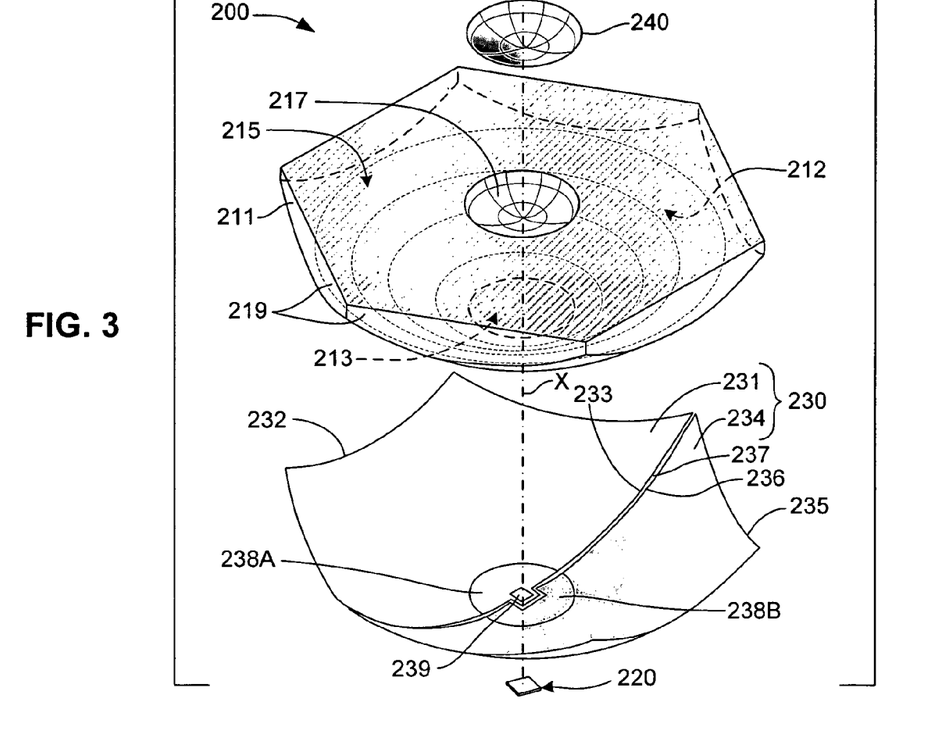
FIG. 3 is an exploded perspective view showing a concentrating solar collector cell according to another embodiment of the present invention.
Figure 4:
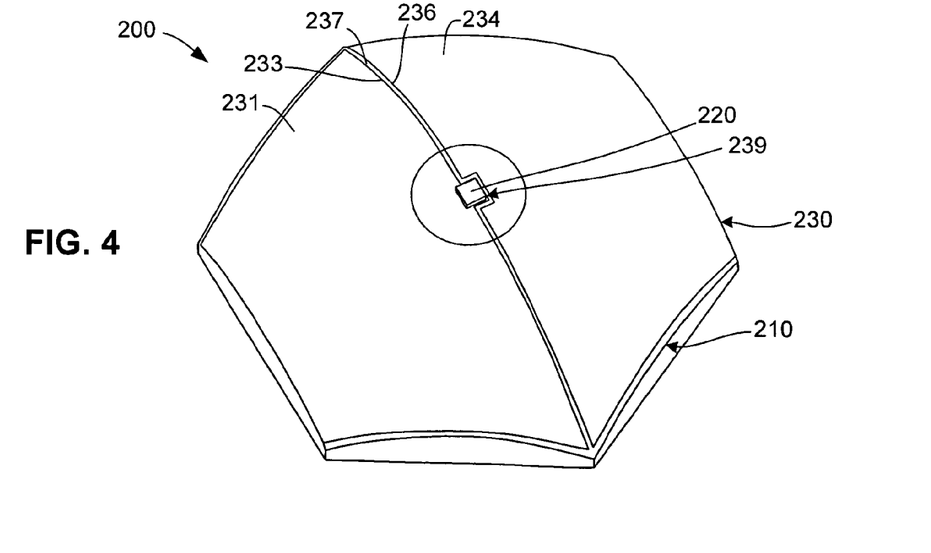
FIG. 4 is a bottom-side perspective view showing the concentrating solar collector cell of FIG. 3.

FIGS. 3 and 4 are top-side exploded perspective and bottom-side assembled perspective views showing a concentrating solar collector 200 according to another embodiment of the present invention. Similar to concentrating solar collector 100, concentrating solar collector 200 includes an optical element 210, a photovoltaic cell 220, a primary mirror 230, and a secondary mirror 240. Optical element 210 is similar in shape to optical element 110, and includes upper region 211, a relatively large convex surface 212, a substantially flat aperture surface 215, and a relatively small concave surface 217. Photovoltaic cell 120 is located in a central region 213. Primary mirror 230 and secondary mirror 240 are formed on convex surface 212 and concave surface 217, respectively, substantially in the manner described above, but with the feature described below.

As indicated in FIG. 3, a peripheral edge of upper region 211 of optical element 210 includes six contiguous facets 219. As discussed in further detail below, this six-sided arrangement facilitates the formation of large arrays of concentrating solar collectors 200 in a highly space-efficient manner. In other embodiments, less space-efficient concentrating solar collector arrays may be produced using concentrators having other peripheral shapes (e.g., the circular peripheral shape of concentrator 100, described above).

In accordance with another aspect of the present invention, primary mirror 230 includes a first metal film portion 231 disposed on a first half of convex surface 212, and a second metal film portion 234 disposed on a second half of convex surface 212. First metal film portion 231 includes a half-hexagonal peripheral edge 232 and a substantially semi-circular inner edge 233, and second metal film portion 234 includes a half-hexagonal peripheral edge 235 and a substantially semi-circular inner edge 236. A thin gap 237, which is made as narrow as possible to avoid the loss of reflected light, is defined between inner edges 233 and 236 to facilitate electrical isolation between metal film portions 231 and 234. As described in additional detail below, the formation of primary mirror 230 using two or more spaced-apart metal film portions facilitates the use of primary mirror 230 as the conductive path electrically linking photovoltaic cells of adjacent collectors in a concentrating solar collector array. Similar to collector 100 (described above), convex surface 212 is provided with a flattened central region 213. In the present embodiment, primary mirror 230 includes a corresponding flattened structure including a first flattened portion 238A that is integrally connected to first metal film portion 231, and a second flattened portion 238B that is integrally connected to second metal film portion 234. In accordance with another aspect, these flattened portions are also separated by gap 237, and one of these flattened portions (e.g., first flattened portion 238A) defines an opening 239 that coincides with optical axis X to facilitate the passage of reflected light to photovoltaic cell 220, which is secured to flattened central region 213 substantially as described above and shown in FIG. 4.

Figure 5:
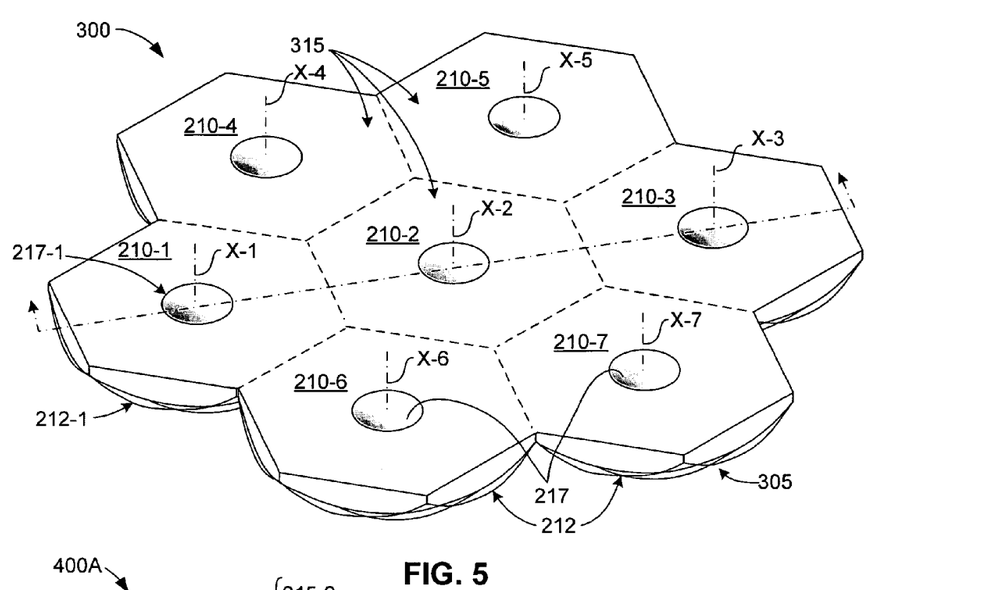
FIG. 5 is a perspective view showing an optical panel according to another embodiment of the present invention.
Figure 6:
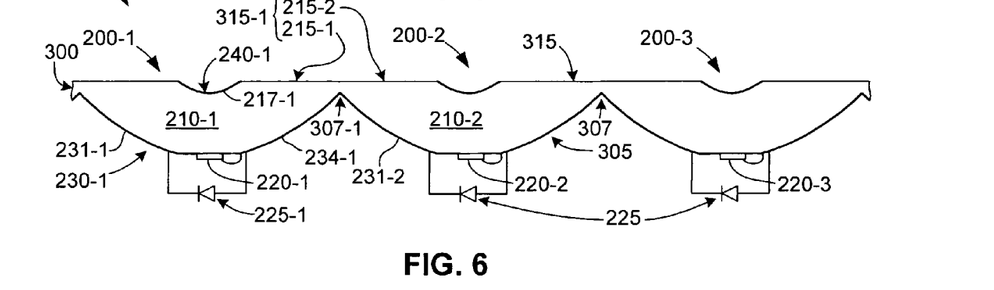
FIG. 6 is a simplified side view showing a concentrating solar collector array including the optical panel of FIG. 5 according to another embodiment of the present invention.

FIG. 5 is a perspective view showing a solid, light-transparent optical panel 300 according to another embodiment of the present invention, and FIG. 6 is a simplified side view showing a concentrating solar collector array 400A including optical panel 300.

Referring to FIG. 5, optical panel 300 is a solid, light-transparent plate that includes a integrated array of optical element portions 210-1 to 210-7 (delineated by dashed lines) arranged in a honeycomb pattern, where each optical element portion 210-1 to 210-7 is substantially identical to optical element 210 (which is described above with reference to FIGS. 3 and 4). As such, optical panel 300 includes a lower surface 305 having multiple protuberances (convex surfaces) 212 that are separated by troughs 307 (indicated in FIG. 6), and a substantially flat aperture (upper) surface 315 including relatively small, spaced-apart depressions (convex surfaces) 217, with each protuberance 212 and associated depression 217 being symmetrical about an associated optical axis X-1 to X-7 that passes through a center of both structures. For example, optical element portion 210-1 includes a protuberance 212-1 and a depression 217-1 that are symmetrical and about and intersected by an optical axis X-1. As indicated in FIG. 6, aperture surface 315 is collectively formed by adjoining aperture surface portions 215 of the adjacent optical element portions. For example, a section 315-1 of aperture surface 315 is formed by aperture surface portion 215-1 of optical element portion 210-1 and aperture surface portion 215-2 of optical element portion 210-2. An advantage provided by optical panel 300 is that it facilitates arraying many small concentrators together in a space efficient manner in order to keep the volume of glass from becoming excessively large, and to keep the amount of power per PV cell manageable without active cooling. Further, aperture surface 315 is essentially flat, and therefore relatively easy to clean, thus minimizing maintenance costs. In the preferred embodiment, optical element panel 300 is 5 to 20 mm thick, and each concentrator 200 is 20 to 80 mm wide. Therefore, optical panel 300 is relatively thin and flat, and therefore relatively easy to mold.

FIG. 6 shows a section of array 400A including concentrating solar collectors 200-1, 200-2 and 200-3 electrically connected in series, where each concentrating solar collectors 200-1, 200-2 and 200-3 is substantially identical to concentrating solar collector 200 (described above with reference to FIG. 4). In accordance with another aspect of the present invention, the metal film portions of adjacent collectors are integrally connected at adjacent troughs, and the metal film portions of adjacent collectors of adjacent collector is electrically coupled by an associated photovoltaic cell, thereby forming a conductive path between adjacent collectors. For example, metal film portions 231-1 and 234-1 of collector 200-1 are electrically coupled by photovoltaic cell 220-1, and metal film portion 234-1 of collector 200-1 is connected to metal film portion 234-2 of collector 200-2 at trough 307-1. Collectors 200-2 and 200-3 are similarly linked together, thereby forming a series-connected "row" of collectors including collectors 200-1, 200-2 and 200-3. In accordance with an embodiment, each collector 200-1, 200-2 and 200-3 also includes a bypass diode 225, each bypass diode having an anode connected to its first metal film portion 231 and a cathode connected to its second metal film portion 234. For example, collector 200-1 includes a diode 225-1 having an anode connected to metal film portion 231-1 and a cathode connected to metal film portion 234-1. Bypass diodes 225 facilitate series operation (i.e., avoid an open circuit condition) by facilitating bypass of a malfunctioning collector due to failure of its photovoltaic cell. Those skilled in the art will recognize that bypass resistors represent only one circuit for facilitating such series operation.

Figure 7:
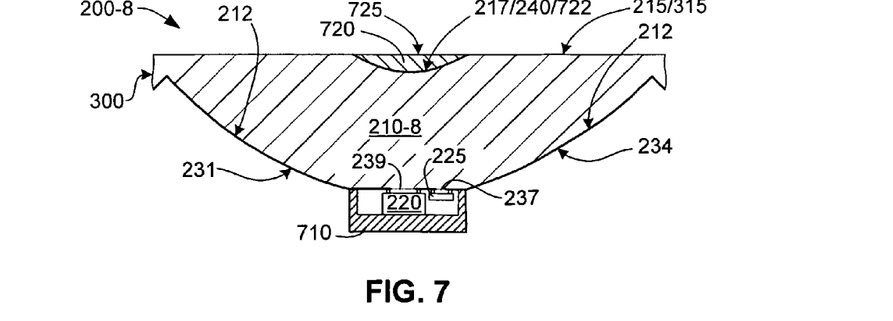
FIG. 7 is a cross-sectional side view showing a concentrating solar collector cell of the array of FIG. 6 in additional detail.

FIG. 7 is a cross-sectional side view showing concentrating solar collector 200-8 according to another embodiment of the present invention. Concentrating solar collector 200-8 is essentially identical to collectors 200-1 to 200-7 (discussed above) with the following optional features.

In accordance with a first optional embodiment shown in FIG. 7, concentrating solar collector 200-8 utilizes surface mount integrated circuit packages to mount photovoltaic cell 220 and bypass diode 225 onto metal film portions 231 and 234. In the disclosed embodiment, bypass diode 225 is mounted, for example, using solder bumps, such that bypass diode 225 straddles gap 237, with its anode being connected to an extended portion of metal film portion 231, and its cathode terminal being connected to an extended portion of metal film portion 234. Similarly, photodiode cell 220 includes a front-side mounting package that facilitates mounting onto metal film portion 231 such that a light-receiving region of photodiode cell 220 is located over opening 239.

In accordance with another alternative embodiment, concentrating solar collector 200-8 includes a heat sink that is mounted to a backside surface of photodiode cell 220, and includes arms that connect to metal film portions 231 and 234, thus facilitating efficient heat transfer during operation. Note that heat sink 230 may also provide at least part of the electrical connection of photodiode cell 220 to at least one of metal film portions 231 and 234 (e.g., by connecting an anode of photodiode cell 220 to metal film portion 234. In one alternative production method, photodiode cells and bypass diodes may be mounted onto special heat sink structures that provide all electrical connections to the primary mirror metal film sections when mounted onto an associated protrusion, thereby facilitating a convenient vehicle for testing the photodiode cells before mounting into an array. In another alternative embodiment (not shown), the photovoltaic cells may be recessed into the optical panel, and the heat sink implemented as a substrate that brides across or otherwise connected to the mirror metal film sections located on the edges of the recessed region.

In accordance with yet another alternative embodiment, a sealant structure 720 (e.g., glass or plastic) is formed over secondary mirror 240 such that secondary mirror 240 is sealed between a contoured (curved) lower surface 722 of sealant structure 720 and concave surface 217 of optical panel portion 210-8. An upper surface 725 of sealant structure 720 is flat and coplanar with upper surface 215/315 of portion 210-8/optical panel 300. Sealant structure 720 serves to further simplify the maintenance/cleaning process by providing a completely flat surface, and also serves to protect secondary mirror 240 from corrosion due to environmental exposure. Although not shown, a similar sealant layer and/or reinforcing structure may be provided on the lower side of the optical panel for added strength and to protect the primary mirror films.

Figure 8A:
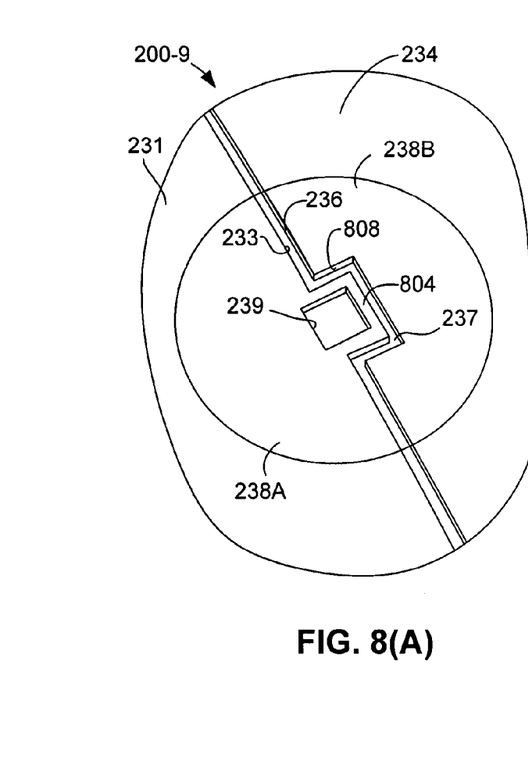
FIGS. 8(A), 8(B) and 8(C) are enlarged, rear-side perspective views depicting a method for mounting a photovoltaic cell and a bypass diode on the concentrating solar collector cell of FIG. 7 according to another embodiment of the present invention.
Figure 8B:
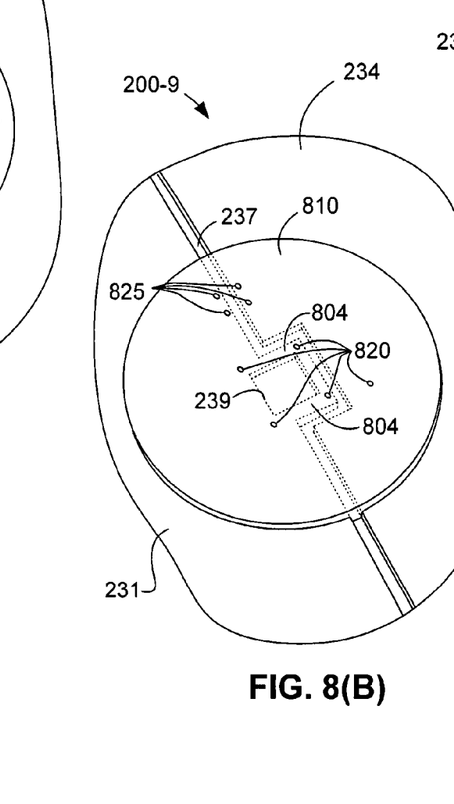
Figure 8C:
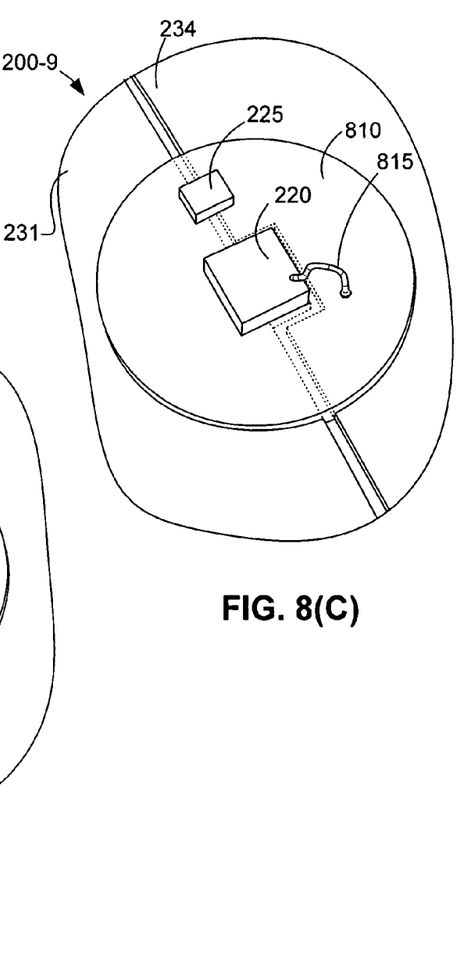

FIGS. 8(A), 8(B) and 8(C) are perspective views illustrating lower central regions of an exemplary concentrating solar collector 200-9 during a production process according to another embodiment of the present invention. Concentrating solar collector 200-9 is essentially identical to collectors 200-1 to 200-7 (discussed above) with the following additional features.

Referring to FIG. 8(A), metal films 231 and 234 are formed as described above with flat portions 238A and 238B, respectively. In the present embodiment, flat portion 238A of metal film 231 is provided with a protruding section 804 that defines opening 239, and flat portion 238B of metal film 234 defines a recessed region 808 that provides the necessary area for protruding section 804 while separation gap 237 between inside edges 233 and 236. As indicated in FIG. 8(B), a dielectric layer 810 (e.g., a solder mask) is then formed over flat portions 238A and 238B of metal films 231 and 234 (i.e. bridging gap 237), and vias 820 and 825 are defined through dielectric layer 810 to expose underlying surfaces of flat portions 238A and 238B. The dielectric layer can be applied by known techniques such as jet printing or screen printing. Referring to FIG. 8(C), high-speed pick-and-place equipment is then used to place photovoltaic cell 220 and bypass diode 225 such that solder bumps extending from lower surfaces of the associated packages (or bare dies) are respectively positioned over associated vias formed in dielectric layer 810. A solder reflow process is then performed to secure photovoltaic cell 220 and bypass diode 225 to flat metal film portions 238A and 238B. As indicated by the placement of vias 820, the solder bump connection of photovoltaic cell 220 to the peripheral edges of protruding section 804 (FIG. 8(B)), thus requiring a separate connection to metal film 234. In the disclosed embodiment, this connection is effected by an optional wire bonding process to generate a wire bond 815 between, for example, an anode or cathode of photovoltaic cell 220 and flat portion 238B of metal film 234.

Figure 9:
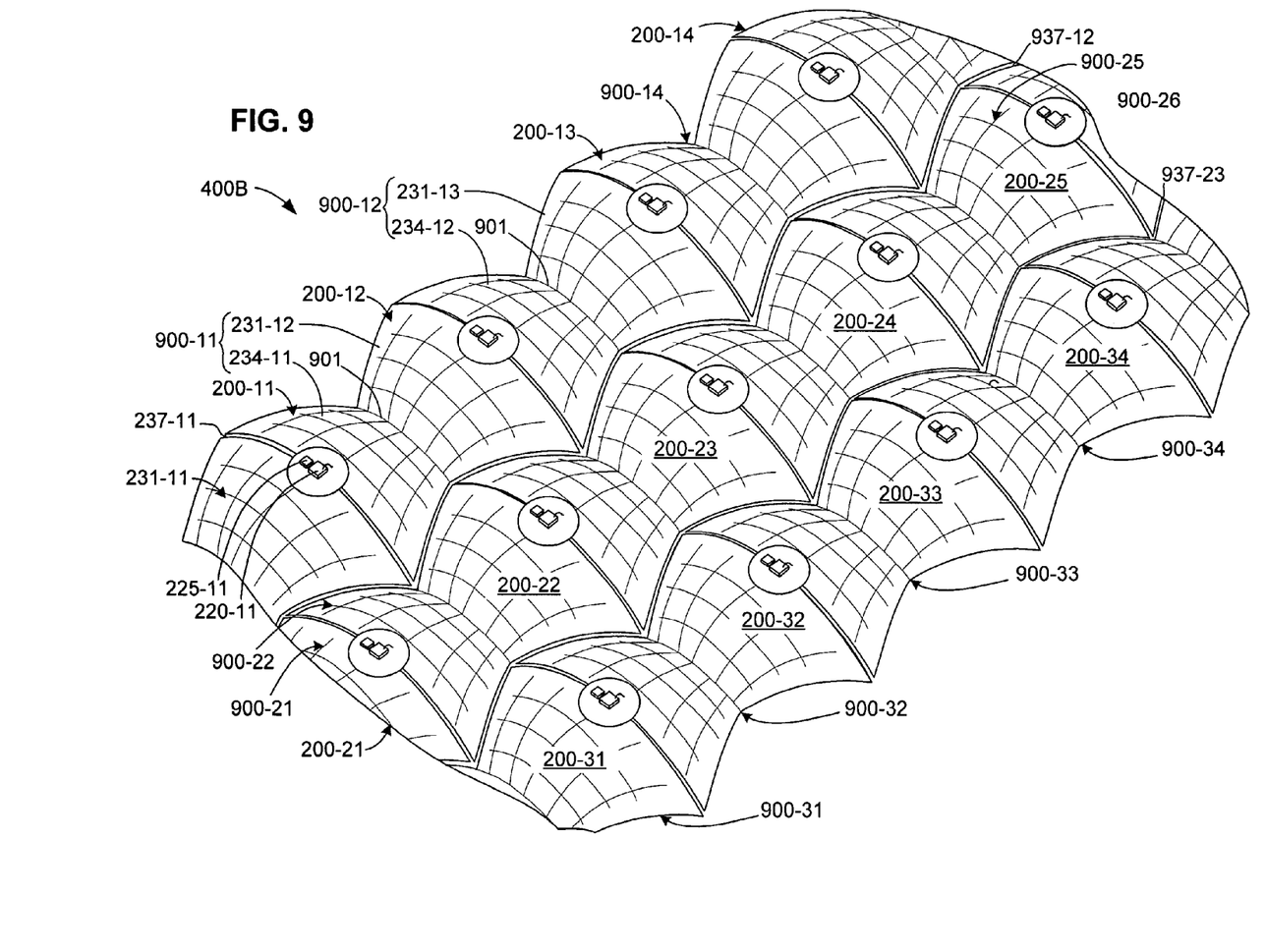
FIG. 9 is a rear-side perspective view showing a concentrating solar collector array according to another embodiment of the present invention.

FIG. 9 is a bottom-side perspective view showing a concentrating solar collector array 400B produced in accordance with another embodiment of the present invention. Array 400B includes several collectors 200-11 to 200-14, 200-21 to 200-25, and 200-31 to 200-34 that are arranged in parallel rows, with collectors 200-11 to 200-14 forming a first row, collectors 200-21 to 200-25 forming a second row, and 200-31 to 200-34 forming a third row. Each collector shown in FIG. 9 is substantially the same as collector 200-9 shown in FIG. 8. As discussed above, the metal film segments of each collector are electrically coupled by an associated photodiode cell and optional bypass diode. For example, metal films 231-11 and 234-11, which are separated by gap 237-11, are electrically coupled by photodiode cell 220-11 and bypass diode 225-11 in the manner described above. In addition, the metal films of each adjacent collector in each row are connected to form an associated metal film segment. For example, metal film 234-11 of collector 200-11 and metal film 231-12 of collector 200-12 are connected along seam 901 to form a substantially half hour-glass-shaped metal film segment 900-11. Similarly, metal film 234-12 of collector 200-12 and metal film 231-13 of collector 200-13 are connected along an associated seam 901 to form metal film segment 900-12. Thus, a conductive path for the row including collectors 200-11 to 200-14 is formed by metal film segments 900-11 to 900-14. Similarly, a conductive path for the row including collectors 200-21 to 200-25 is formed by metal film segments 900-21 to 900-25, and a conductive path for the row including collectors 200-31 to 200-34 is formed by metal film segments 900-31 to 900-34.

Electrical isolation between adjacent metal film segments (i.e., gaps 237), as well as electrical isolation between adjacent rows of metal film segments, is provided by etching or otherwise forming elongated gaps between the associated rows of metal film segments. For example, metal film segments 900-11 to 900-14 are separated from metal film segments 900-21 to 900-25 by an elongated gap 937-12. Similarly, metal film segments 900-21 to 900-25 are separated from metal film segments 900-31 to 900-34 by an elongated gap 937-34. In accordance with an embodiment metal film segments 900-11 to 900-34 consist of a layer of sputtered silver on the optical panel. A mask is then formed, for example, using known wax-printing techniques. Two-sided printing can be employed in order to define the two sides of the optic. The optical panel is then immersed one or more plating baths to build up the metal thickness required for the string wiring. In one embodiment, layers of electroplated copper and nickel formed on the silver but do not plate onto the mask. The copper would need to be on the order of 1 micron thick in order to serve as a sufficiently conductive layer to limit the electrical loss to less than 1% of the converted power. Once the plating is complete, the mask is stripped and the metal mirror coating is etched away, using the plated metal as an etch mask. The intent is to etch the mirror metal away from the clear aperture (exposing an anti-reflective coating formed thereon) on the upper side, and opening up the gaps 237 and 937 on the lower side to form the necessary metal film segments. Subsequent process, e.g., to mount photovoltaic cells, is then performed using the methods described above.

Figure 10:
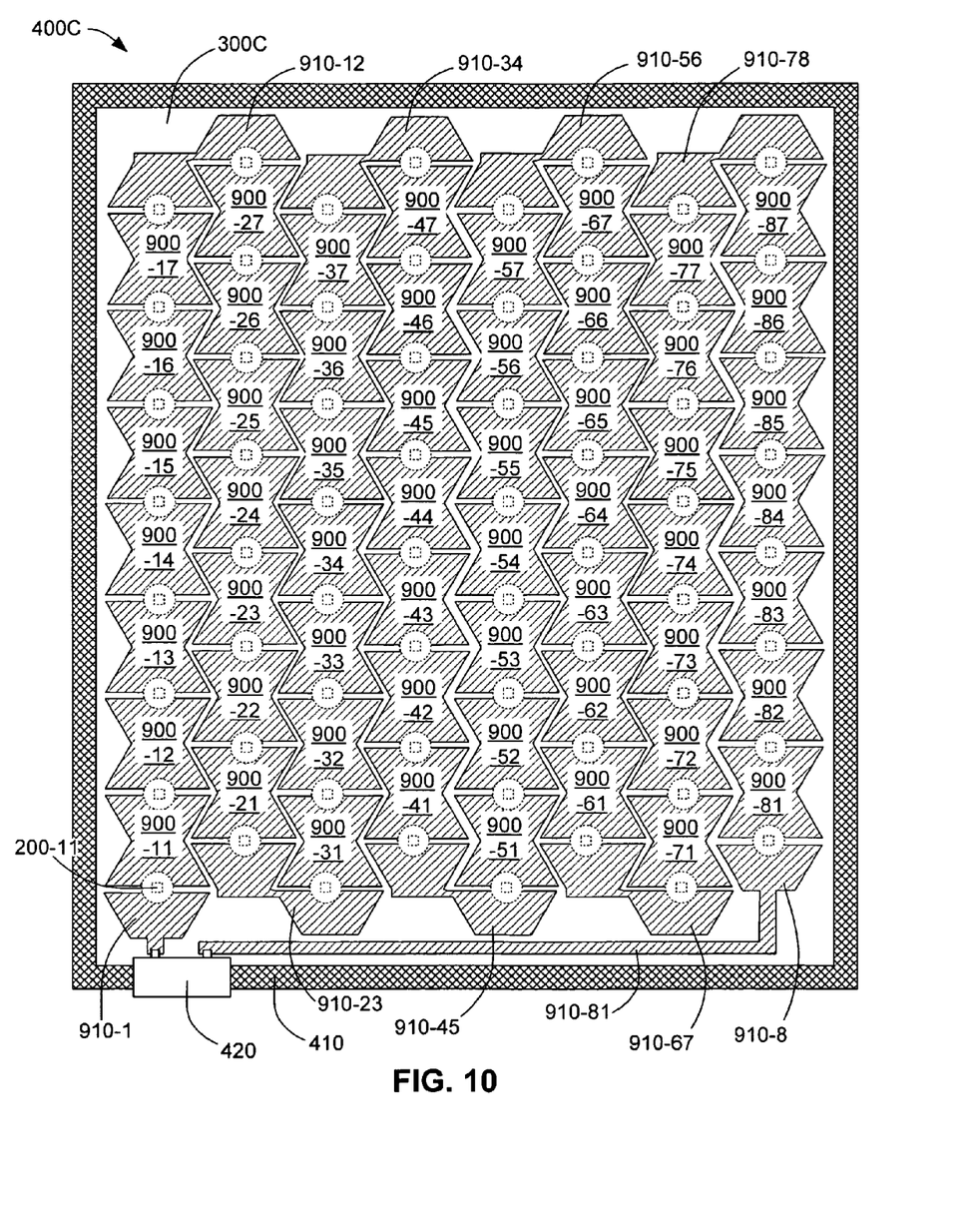
FIG. 10 is a simplified plan view showing a solar collector device including the concentrating solar collector array of FIG. 9.

FIG. 10 is a plan view showing a concentrating solar collector unit 400C according to another embodiment of the present invention. Concentrating solar collector unit 400C includes an optical panel 300C formed in the manner described above, a metal support frame 410 (e.g., aluminum or steel) for supporting and protecting optical panel 300C, and a socket connector 420 for mounting collector unit 400C in a collector array network (not shown). Optical panel 300C include several rows of concentrating solar collectors that are linked as described above by metal film segments 900-11 to 900-87. End segments 910-12, 910-23, 910-34, 910-45, 910-56, 910-67, and 910-78 provide connections between adjacent rows in the indicated manner, and partial segments 910-1 and 910-8 are utilized in conjunction with metallization segment 910-81 to provide connections between the collectors and socket connector 420. The depicted segment pattern is greatly simplified and provided only for illustrative purposes, and those skilled in the art will recognize that many alternative patterns may be used. The circles separating each adjacent include, for example, the dielectric regions and circuit components described above (e.g., photovoltaic cell 200-11 is indicated between segments 900-11 and 900-12). Although all of the collectors depicted in unit 400C are connected in one serial string that includes all eight rows linked by end segments, it is understood that a two or more serial strings may be formed in a similar manner on each unit.

Although the present invention has been described with respect to certain specific embodiments, it will be clear to those skilled in the art that the inventive features of the present invention are applicable to other embodiments as well, all of which are intended to fall within the scope of the present invention. For example, some beneficial aspects of the invention may be achieved in a two-pane arrangement where the secondary mirrors are formed on a first (front) pane and the primary mirrors are formed on a second (back) pane in the manner described above. Although such an arrangement would benefit from, for example, utilization of the primary mirror films to provide string wiring, such an arrangement would require positioning of panes during assembly and increase maintenance costs. In another alternative embodiment, the primary and secondary mirrors may be preformed and then mounted to the optical element using a suitable adhesive, but this approach may substantially increase production costs. In yet another alternative embodiment, the curved surface utilized to form the secondary mirror may be convex instead of concave, thus being in the form of a classical Gregorian type system. In yet another alternative embodiment, the curved surfaces utilized to form the primary and secondary mirrors may be elliptical, ellipsoidal, spherical, or other curved shape.

The invention claimed is:

1. A concentrating solar collector comprising:
a solid, light-transparent optical element having a first side including a relatively large convex surface, a second side including an aperture surface, and a relatively small curved surface defined in a central portion of the aperture surface, wherein the aperture surface is substantially flat such that parallel light beams directed perpendicular to and passing through the aperture surface remain parallel while passing through the optical element between the aperture surface and the convex surface;
a primary mirror disposed on the convex surface; and
a secondary mirror disposed on the curved surface.

2. The concentrating solar collector according to claim 1, further comprising a photovoltaic element disposed in a central region surrounded by the convex surface.

3. The concentrating solar collector according to claim 1, wherein the primary mirror and secondary mirror comprise reflective mirror films formed directly onto the convex surface and the curved surface, respectively.

4. The concentrating solar collector according to claim 3, wherein the primary mirror and the secondary mirror comprise identical reflective mirror materials.

5. A concentrating solar collector comprising:
a solid, light-transparent optical element having a first side including a relatively large convex surface, a second side including a substantially flat aperture surface, and a relatively small curved surface defined in a central portion of the aperture surface;
a primary mirror disposed on the convex surface; and
a secondary mirror disposed on the curved surface, wherein the primary and secondary mirrors define a coincident optical axis and are shaped such that a light beam traveling substantially parallel to the optical axis and directed through every region of the aperture surface is reflected by a corresponding region of the primary mirror toward the secondary mirror, and is re-reflected by a corresponding region of the secondary mirror toward a central region surrounded by the convex surface.

6. The concentrating solar collector according to claim 5, wherein the primary mirror defines a first conic surface and the secondary mirror defines a second conic surface, wherein the first and second conic surfaces are aligned such that a light beam directed parallel to the optical axis onto any point of the first conic surface is reflected to a corresponding point of the second conic surface, and from the corresponding point to the central region.

7. The concentrating solar collector according to claim 5, wherein both the convex surface and the curved surface are substantially symmetrical about the optical axis and the aperture surface is substantially perpendicular to the optical axis.

8. The concentrating solar collector according to claim 1, wherein the primary mirror comprises a first metal film portion disposed on a first region of the convex surface, and a second metal film portion disposed on a second region of the convex surface and separated from the first metal film portion by a gap, and
wherein the concentrating solar collector further comprises a photovoltaic cell disposed over an opening defined by at least one of the first and second metal film portions define an opening, and electrically connected between the first metal film portion and the second metal film portion.

9. The concentrating solar collector according to claim 8, wherein the optical element further comprises a flat central region surrounded by the convex surface,
wherein the flat central region located such that it is intersected by the optical axis, and
wherein each of the first and second metal film portions include a flat section disposed on the flat central region.

10. The concentrating solar collector according to claim 8, further comprising a bypass diode having an anode connected to the first metal film portion and a cathode connected to the second metal film portion.

11. The concentrating solar collector according to claim 8, further comprising a heat sink mounted on the photovoltaic cell.

12. The concentrating solar collector according to claim 8, further comprising a dielectric layer disposed between the photovoltaic element and the central region of the optical element.

13. The concentrating solar collector according to claim 1, further comprising a sealant structure formed over the secondary mirror such that the secondary mirror is between a curved surface of the sealant structure and the curved surface of the optical element.

14. A concentrating solar collector comprising:
a solid, light-transparent optical element consisting of an optical material and having a first side including a relatively large convex surface, a second side including a flat aperture surface, and a relatively small curved surface defined in a central portion of the aperture surface,
wherein only said optical material is disposed between said relatively large convex surface and said relatively small curved surface, and
wherein both the convex surface and the curved surface are substantially symmetrical about an optical axis and the aperture surface is substantially perpendicular to the optical axis.

15. The concentrating solar collector of claim 14, further comprising:
a primary mirror disposed on the convex surface; and
a secondary mirror disposed on the curved surface.

16. The concentrating solar collector of claim 15, wherein the primary and secondary mirrors are shaped such that a light beam traveling substantially parallel to the optical axis and directed through every region of the aperture surface is reflected by a corresponding region of the primary mirror toward the secondary mirror, and is re-reflected by a corresponding region of the secondary mirror toward a central region that is surrounded by the convex surface.

17. The concentrating solar collector according to claim 16, further comprising a photovoltaic element disposed in the central region.

18. The concentrating solar collector according to claim 16, wherein the primary mirror and secondary mirror comprise reflective mirror films formed directly onto the convex surface and the curved surface, respectively.

19. A concentrating solar collector array comprising:
a solid, light-transparent optical panel including a first surface defining a plurality of relatively large protuberances, and an aperture surface defining a plurality of relatively small depressions, each depression being associated with a corresponding protuberance such that each depression and its associated corresponding protuberance form an optical element portion of the optical panel, wherein the aperture surface is substantially flat such that parallel light beams directed perpendicular to and passing through the aperture surface remain parallel while passing through the optical element between the aperture surface and a corresponding one of said plurality of protuberances;

a plurality of primary mirrors disposed on the first surface such that each primary mirror is disposed on a corresponding protuberance of the plurality protuberances; and a plurality of secondary mirrors, each secondary mirror being disposed in a corresponding depression of the plurality of depressions.

20. The concentrating solar collector array of claim 19, wherein the plurality of primary mirrors comprise a plurality of spaced-apart metal film segments formed on the first surface, and wherein the concentrating solar collector array further comprises a plurality of photovoltaic cells, each photovoltaic cell being coupled between an associated pair of said plurality of space-apart metal film segments.

21. The concentrating solar collector array of claim 20, wherein the plurality of spaced-apart metal film segments are coupled in series by the plurality of photovoltaic cells.

22. The concentrating solar collector array of claim 21, further comprising a plurality of bypass transistors, each bypass transistor being connected in parallel with an associated photovoltaic cell of the plurality of photovoltaic cells.

23. A concentrating solar collector array comprising:

an optical panel consisting of a solid, light-transparent optical material having a first side and a second side, wherein only said optical material is disposed between the first and second sides;

a plurality of spaced-apart electrically conductive metal film segments mounted on the first side of the optical panel and arranged in rows, wherein each metal film segment includes a reflective surface facing into the optical panel toward the second side; and a plurality of photovoltaic cells mounted on the first side of the optical panel, each photovoltaic cell electrically connected between a pair of adjacent metal film segments such that the metal film segments of each row are connected in series by the associated photovoltaic cells, wherein the optical panel includes a plurality of protuberances formed by said optical material and disposed on the second side such that each protuberance forms an associated optical element portion of the optical panel, and wherein the first surface is substantially flat such that parallel light beams directed perpendicular to and passing through the first surface remain parallel while passing through the optical panel between the aperture surface and a corresponding one of said plurality of protuberances.

24. The concentrating solar collector array of claim 23, wherein each metal film segment of the plurality of metal film segments extend between a pair of adjacent protuberances.

25. The concentrating solar collector of claim 1, wherein the primary mirror and secondary mirror define a focal region, and wherein the focal region is located at a mesa extending below the convex surface of the solid optical element.

* * * * *